United States Patent Office 3,551,160

Patented Dec. 29, 1970

3,551,160

METHOD OF PREPARING PHOTOSENSITIVE POLY(2-CHLORO-1,3-BUTADIENE)

Peter Bakos, Apalachin, and Gary S. Kozak, Binghamton, N.Y., assignors to International Business Machines Corporation, Armonk, N.Y., a corporation of New York No Drawing. Filed Oct. 13, 1967, Ser. No. 675,030

Int. Cl. G03c 1/68

U.S. Cl. 96—115 10 Claims

ABSTRACT OF THE DISCLOSURE

A method of preparing photosensitive poly(2-chloro-1,3-butadiene) (polychloroprene) is described. Polychloroprene is dissolved in a cyclic ketone. The cyclic ketone solution is rendered basic and is heated for a time sufficient to cause a reaction to occur. Photosensitive polychloroprene is precipitated from the solution by the addition of a nonsolvent. The precipitate is redissolved in a suitable solvent and is stored. This photosensitive polychloroprene solution is used as a photoresist for metal etching applications, circuit insulation, relief images and lithographic printing.

FIELD OF THE INVENTION

This invention relates to a method for rendering polychloroprene photosensitive; more specifically it relates to a method of rendering polychloroprene photosensitive by reacting the same with a strong base in a cyclic ketone and to a lightsensitive polychloroprene composition prepared by the method of this invention.

DESCRIPTION OF THE PRIOR ART

It is well known in the art to use photopolymerizable materials as photoresists for metal etching purposes. Various substrates, such as metal plates, are coated with photopolymerizable materials and exposed to light under a pattern. Upon light exposure, the exposed areas become insolubilized and will not be softened and washed off as the unexposed areas are upon solvent development. The released image obtained in this manner may be used as a copy of the original, it may be used for printing purposes, as a resist for metal etching purposes and as an insulating surface.

In the past, any number of photopolymerizable materials have been used for the above purposes. However, desirable as it is in many other applications, polychloroprene (neoprene), a nonphotosensitive polymeric material formed as the polymerization product of 2-chloro-1,3-butadiene, has seldom been used with success for any of the above purposes. This is probably due to the tendency of the unvulcanized elastomer to decrease in molecular weight, i.e., to depolymerize on exposure to actinic radiation. Where unvulcanized neoprene has been used for analogous purposes, i.e., printing plates, etc., it has been necessary to compound the elastomer with a photoinitiator and a photopolymerizable monomeric material, e.g., a photosensitive and compatible ethylenically unsaturated compound, to effectively increase its molecular weight, i.e., to insolubilize it. Pat. Nos. 3,024,180 and 3,169,868 are illustrative of the prior art.

More recently, in copending application Ser. No. 586,371, to Gary S. Kozak and Peter Bakos, and having the same assignee as the present application, now abandoned applicants have disclosed photoresist compositions consisting of polychloroprene as a binder and a photosensitizer which may be selected from one of the following compounds: 4, 4′-bis-(dimethylamino)benzophenone, diphenyl diketone, 9-xanthenone and 4,4′-bis-(diethylamino)benzophenone. Applicants. there, were able to effectively photosensitive polychloroprene without the addition of photopolymerizable monomeric materials. In general, the prior art requires the addition of the external sensitizer and/or an ethylenically unsaturated compound to polychloroprene to photosensitize the same.

SUMMARY OF THE INVENTION

According to the present invention, there is provided a method of preparing photosensitive polychloroprenene from unvulcanized polychloroprene without the addition of an initiator and/or a photopolymerizable monomeric material thereto. An unvulcanized polychloroprene is dissolved in a cyclic ketone to which is added a strong chemical base. The mixture is heated to a temperature sufficient to solubilize the base, e.g., 90° C. to 130° C. Heating is continued from about 0.25 to 2 hours and the solution is subsequently cooled. The cooled solution is then added to a nonsolvent from which is precipitated the photosensitive polychloroprene. Alternately, the nonsolvent may be added to the photosensitive polychloroprene solution. The precipitated material is then redissolved in a suitable solvent and stored. This solution can subsequently be used as a photoresist in an etching operation. Etching is accomplished without undercutting or line damage, when the photoresist composition of this invention is used.

OBJECTS

It is therefore an object of the invention to provide a unique method of preparing photosensitive polychloroprene.

Another object of the invention is the provision of an inexpensive photoresist composition utilizing the photosensitive polychloroprene of this invention.

DESCRIPTION OF PREFERRED EMBODIMENTS

Described from a more detailed aspect, the present invention involves a method including the steps:

(a) Dissolving polychloroprene in a cyclic ketone;

(b) Adding a strong chemical base to the resultant solution;

(c) Heating the solution at a temperature sufficiently high to solubilize said strong chemical base and to cause the same to react with said polychloroprene and subsequently cooling the same;

(d) Precipitating the photosensitive polychloroprene by the addition of a nonsolvent to said photosensitized polychloroprene solution and drying the same;

(e) Redissolving the precipitate in a suitable solvent and storing the same for subsequent use as a photoresist material.

Any general purpose unvulcanized polychloroprene may be used as the polychloroprene to be photosensitized. The preferred polychloroprene is one known as "Neoprene W," a polychloroprene prepared from 2-chloro-1,3-butadiene by E. I. du Pont de Nemours, Inc. "Neoprene W" is an improved polymer having a uniform molecular weight distribution and which contains no sulfur or other compounds capable of decomposing to yield either free sulfur or a vulcanization accelerator. The polymer binder used in this invention has a number average molecular weight of about 500,000.

The cyclic ketone solvent of choice may be selected from any cyclic ketone, such as cyclopentanone, cycloheptanone, cyclooctanone, cyclohexanone, 2-methyl cyclohexanone, 4-methyl cyclohexanone or 2,4-dimethyl cyclohexanone.

The strong chemical base may be selected from the alkali metal hydroxides or substituted organic bases. For example, phenyl trimethyl ammonium hydroxide and potassium hydroxide can be used to obtain equally good results.

The nonsolvent used to precipitate the photosensitive polymer may be selected from low molecular weight alcohols, water, acetone, petroleum ether (a mixture of low molecular weight hydrocarbons), admixtures thereof, as well as other solvents known to those skilled in the art to be nonsolvents for polymeric solutions. Suitable solvents for the precipitated polymer are chosen from the aromatic hydrocarbons and halogenated hydrocarbons, such as benzene, toluene, xylene, halogenated benzene, toluene, xylene, methylene chloride, tetrachlorethane, and the like.

In order that those skilled in the art may better understand how the present invention may be practiced, the following examples are given by way of illustration and not by way of limitation. All parts and percents are by weight unless otherwise noted.

EXAMPLE 1

A solution of "Neoprene W" in cyclohexanone is prepared in which 12.5 grams of said "Neoprene W" are dissolved in 200 milliliters of cyclohexanone. The solution is heated to a temperature of about 105° C. at which time 2.5 grams of potassium hydroxide are added. The reaction temperature is maintained for 1½ hours. After slightly cooling the reaction solution, it is decanted into 600 milliliters of methanol. The resultant precipitate is air dried and redissolved in xylene. The solution containing the photosensitized polychloroprene is now available for use as a photoresist. For example, copper clad laminates are coated with the above solution by dipping, spraying, and spin coating. The coating is dried by forced ambient air and/or infrared techniques. The coated substrate is then exposed to a standard high pressure mercury or carbon arc source under a predetermined pattern for 60 seconds, and development of the image is effected by total immersion of the sample into a good solvent, such as benzene. The exposed polychloroprene coating adheres tenaciously to the substrate and is both acid and base resistant. However, it can be removed by brush washing in hot halogenated aromatic hydrocarbons.

EXAMPLE 2

A solution of "Neoprene W" in 2 either/or, 4 methyl cyclohexanone is prepared in which 12.5 grams of said "Neoprene W" are dissolved in 200 milliliters of 2,4-dimethyl cyclohexanone. The solution is heated to a temperature of about 95° C. at which time from 5 ml. to 25 ml. of a 40% solution of phenyl-trimethyl ammonium hydroxide dissolved in methanol is added. The reaction temperature is maintained for about 2 hours. After slightly cooling the reaction solution, it is decanted into 600 milliliters of ethanol. The resultant precipitate is treated as above in Example 1 with the same results obtaining therefrom.

EXAMPLE 3

A "Neoprene W" solution is prepared and is treated as in Example 1 except that the "Neoprene W" is dissolved in cycloheptanone. A photosensitive polychloroprene similar to that of Example 1 is obtained.

EXAMPLE 4

A "Neoprene W" solution is prepared and is treated as in Example 2 except that the "Neoprene W" is dissolved in cyclopentanone. A photosensitive polychloroprene similar to that of Example 2 is obtained.

Thus, it has been shown that this invention relates to the rendering of polychloroprene (a material otherwise insensitive to light and which normally decomposes when exposed to actinic radiation), sensitive to actinic radiation. The sensitivity of the polychloroprene is attained by the reaction of unvulcanized polychloroprene with a strong chemical base in a cyclic ketone. The photosensitive polymer is precipitated from its solution and redissolved in a suitable solvent. The redissolved polymer makes for excellent, inexpensive photoresist material.

While the invention has been particularly shown and described with reference to the preferred embodiments thereof, it will be understood by those skilled in the art that various changes in form and details may be made therein without departing from the spirit and scope of the invention.

What is claimed is:

1. A method of rendering unvulcanized polychloroprene sensitive to actinic radiation including the steps of:

(a) dissolving unsensitized polychloroprene in a cyclic ketone solvent;

(b) adding to said solution a strong chemical base;

(c) heating the resulting alkaline solution to a temperature sufficient to cause said strong chemical base to react with said polychloroprene solution to thereby produce photosensitized polychloroprene.

2. The method of claim 1 wherein the cyclic ketone is selected from the group consisting of cyclopentanone, cycloheptanone, cyclooctanone, cyclohexanone, 2-methyl cyclohexanone, 4-methyl cyclohexanone and 2,4-dimethyl cyclohexanone.

3. The method of claim 2 wherein said strong chemical base is selected from the group consisting of alkaline metal hydroxides and strong substituted organic bases.

4. The method of claim 3 wherein said alkaline reaction solution is heated to a temperature of from 90° C. to 130° C.

5. The method of claim 4 wherein said alkaline solution is heated from about 0.25 to 2 hours.

6. The method of claim 5 wherein said photosensitive polychloroprene is precipitated from the reaction solution by the addition of a nonsolvent for said photosensitive polychloroprene.

7. The method of claim 6 wherein said nonsolvent is selected from the group consisting of low molecular weight alcohols, water, petroleum ether, acetone, and admixtures thereof.

8. The method of claim 6 wherein said precipitated photosensitized polychloroprene is redissolve in a suitable solvent and is stored for long periods of time.

9. A photosensitive polychloroprene composition prepared by the method of claim 1.

10. A polychloroprene photoresist composition prepared by the method of claim 8.

References Cited

UNITED STATES PATENTS

| | | | |
|---|---|---|---|
| 1,761,424 | 6/1930 | Brockway | 96—115 |
| 2,751,365 | 6/1956 | Scott | 260—92.3 |
| 3,444,152 | 5/1969 | Gintz et al. | 260—92.3 |

NORMAN G. TORCHIN, Primary Examiner

J. GOODROW, Assistant Examiner

U.S. Cl. X.R.

260—92.3